United States Patent
Ogawa et al.

(10) Patent No.: US 9,570,504 B2
(45) Date of Patent: Feb. 14, 2017

(54) METHOD OF MANUFACTURING IMAGING APPARATUS HAVING ETCHED AND PLANARIZED INSULATING LAYER

(71) Applicant: CANON KABUSHIKI KAISHA, Tokyo (JP)

(72) Inventors: Toshiyuki Ogawa, Abiko (JP); Sho Suzuki, Yokohama (JP); Shunsuke Takimoto, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/837,908

(22) Filed: Aug. 27, 2015

(65) Prior Publication Data

US 2016/0079302 A1 Mar. 17, 2016

(30) Foreign Application Priority Data

Sep. 11, 2014 (JP) ................................. 2014-184866

(51) Int. Cl.
*H01L 27/146* (2006.01)

(52) U.S. Cl.
CPC ... *H01L 27/14685* (2013.01); *H01L 27/14629* (2013.01); *H01L 27/14687* (2013.01)

(58) Field of Classification Search
CPC .................... H01L 27/14685; H01L 27/14632; H01L 27/14625
See application file for complete search history.

(56) References Cited

U.S. PATENT DOCUMENTS

| 7,759,222 B2 | 7/2010 | Morii et al. |
| 7,947,522 B2 | 5/2011 | Ohtsuka |
| 2006/0138577 A1* | 6/2006 | Hashimoto ......... H01L 27/1462 257/432 |
| 2008/0087976 A1* | 4/2008 | Morii .................. H01L 27/1462 257/446 |
| 2009/0124036 A1* | 5/2009 | Ohtsuka ............ H01L 21/76224 438/57 |
| 2013/0334641 A1* | 12/2013 | Suzuki ............. H01L 31/02325 257/432 |
| 2015/0214269 A1* | 7/2015 | Endo ................. H01L 27/14685 257/443 |

FOREIGN PATENT DOCUMENTS

| JP | 2007-42801 A | 2/2007 |
| JP | 2008-098373 A | 4/2008 |
| JP | 2009-117681 A | 5/2009 |
| WO | 2012/141003 A1 | 10/2012 |

\* cited by examiner

*Primary Examiner* — Kevin Parendo
(74) *Attorney, Agent, or Firm* — Fitzpatrick, Cella, Harper & Scinto

(57) ABSTRACT

Provided is a method of manufacturing an imaging apparatus. The imaging apparatus is formed on a substrate and includes a pixel region and a peripheral circuit region that is arranged on a periphery of the pixel region. The method includes: forming an insulating layer in the pixel region and the peripheral circuit region; etching the insulating layer formed in the pixel region in a state in which the peripheral circuit region is protected; planarizing a surface of the insulating layer; and forming a waveguide in the pixel region. After the forming an insulating layer and before the etching the insulating layer, an average value of heights of a top surface of the insulating layer in the pixel region is larger than an average value of heights of a top surface of the insulating layer in the peripheral circuit region.

8 Claims, 3 Drawing Sheets

METHOD OF MANUFACTURING IMAGING APPARATUS HAVING ETCHED AND PLANARIZED INSULATING LAYER

BACKGROUND OF THE INVENTION

Field of the Invention

The present invention relates to a method of manufacturing an imaging apparatus.

Description of the Related Art

In Japanese Patent Application Laid-Open No. 2008-098373, there is disclosed a technology for an imaging apparatus, aimed at reducing a global step height of an interlayer insulating layer, which is a height difference on a surface of the interlayer insulating layer in an entire chip region.

The imaging apparatus disclosed in Japanese Patent Application Laid-Open No. 2008-098373 includes a pixel region in which a plurality of pixels are arranged, a peripheral circuit region arranged on the periphery of the pixel region, and a scribe-lane region that is a chip peripheral portion. An interlayer insulating layer is formed in each of the regions. The interlayer insulating layer thus formed in each of the regions is planarized by chemical mechanical polishing (CMP).

In the pixel region, protective films for protecting photodiodes are formed, and pattern density of gate electrodes is high. The interlayer insulating layer is formed so as to cover the protective films and the gate electrodes, and hence an average height of the surface of the interlayer insulating layer in the pixel region immediately after film formation is higher than that in the peripheral circuit region. Specifically, the area of the pixel region to be polished in a CMP step is larger than that of the peripheral circuit region, and hence the polishing rate has a gradient over the entire chip. Thus, the surface of the interlayer insulating layer after the CMP step may have a global step height.

In order to reduce the global step height that may be generated in this manner, in the imaging apparatus disclosed in Japanese Patent Application Laid-Open No. 2008-098373, a dummy pattern is formed in each of the peripheral circuit region and the scribe-lane region. Accordingly, an average height of the surface of the interlayer insulating layer in the peripheral circuit region and the scribe-lane region before the CMP step is made closer to an average height of the surface of the interlayer insulating layer in the pixel region, with the result that the global step height is reduced.

In the configuration disclosed in Japanese Patent Application Laid-Open No. 2008-098373, a circuit for scanning the pixels, a circuit for processing signals, and the like are formed in the peripheral circuit region. The dummy pattern needs to be arranged so as not to affect the characteristics of the circuits as much as possible, and hence the peripheral circuit region has a limited area in which the dummy pattern can be formed. Thus, the amount of reducing the difference in average height before planarization may be insufficient when the method involving forming the dummy pattern is employed alone.

SUMMARY OF THE INVENTION

According to one embodiment of the present invention, there is provided a method of manufacturing an imaging apparatus. The imaging apparatus is formed on a substrate and includes a pixel region and a peripheral circuit region that is arranged on a periphery of the pixel region. The method includes: forming an insulating layer in the pixel region and the peripheral circuit region; etching the insulating layer formed in the pixel region in a state in which the peripheral circuit region is protected; planarizing a surface of the insulating layer; and forming a waveguide in the pixel region. After the forming an insulating layer and before the etching the insulating layer, an average value of heights of a top surface of the insulating layer in the pixel region is larger than an average value of heights of a top surface of the insulating layer in the peripheral circuit region.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. In the following description, the same members or parts are denoted by common reference symbols throughout the drawings, and descriptions thereof may sometimes be omitted.

Figure 1:
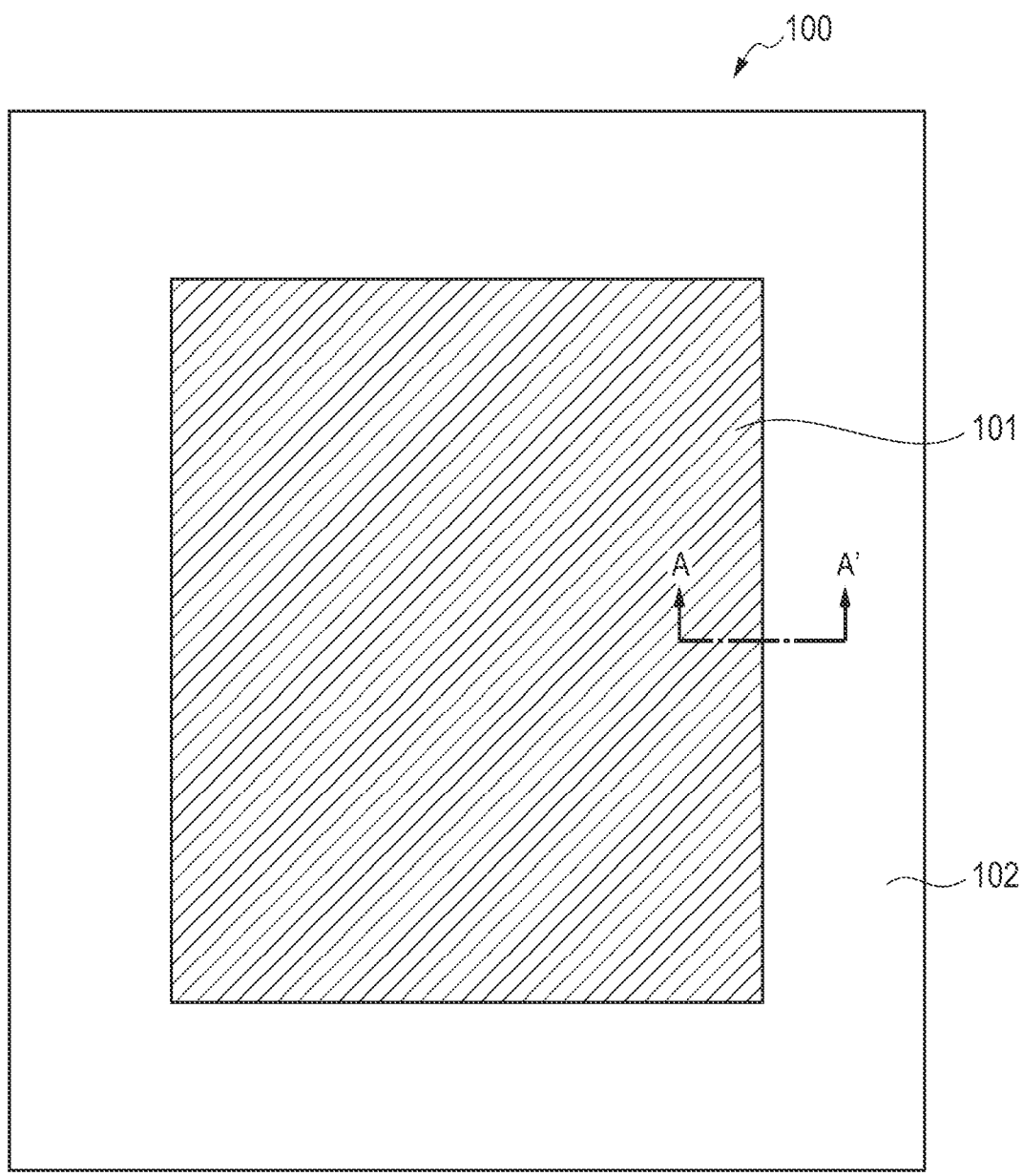
FIG. 1 is a top view of an imaging apparatus according to one embodiment of the present invention.

FIG. 1 is a top view of an imaging apparatus 100 according to one embodiment of the present invention. FIG. 1 is a schematic illustration of a positional relationship of a pixel region 101 and a peripheral circuit region 102 that are included in the imaging apparatus 100.

The imaging apparatus 100 is formed on a semiconductor substrate, such as a silicon substrate. In the pixel region 101, a plurality of pixels are arranged in matrix. Thus, the shape of the pixel region 101 is typically a quadrangle, such as a square and a rectangle. Each pixel includes a photoelectric conversion element, such as a photodiode, and a metal oxide semiconductor field effect transistor (MOSFET) functioning as an amplifier element or a switching element.

The peripheral circuit region 102 is arranged on the periphery of the pixel region 101. The peripheral circuit region 102 includes a scanning circuit configured to scan the pixel region 101, a signal processing circuit configured to process signals output from the pixel region 101, and the like.

The positional relationship of the pixel region 101 and the peripheral circuit region 102 illustrated in FIG. 1 is merely an example, and the pixel region 101 and the peripheral circuit region 102 may have a positional relationship different from that described above. For example, the peripheral circuit region 102 is not necessarily required to be arranged to surround the pixel region 101 as illustrated in FIG. 1. It is only necessary that the peripheral circuit region 102 be arranged so that at least a part of the peripheral circuit region 102 may be adjacent to the pixel region 101.

In FIG. 1, illustration of the structure from the periphery of the peripheral circuit region 102 to an end portion of the semiconductor substrate is omitted. However, a scribe-lane region may be formed outside the peripheral circuit region 102 similarly to Japanese Patent Application Laid-Open No. 2008-098373. The scribe-lane region is a region serving as a boundary with another element in a manufacturing process for the imaging apparatus 100 manufactured in a wafer state. In this case, a dummy pattern may be formed in the scribe-lane region similarly to Japanese Patent Application Laid-Open No. 2008-098373, or may not be formed.

FIGS. 2A to 2E and FIGS. 3A to 3D are cross-sectional views taken along the line A-A' of FIG. 1. Now, the structure of the imaging apparatus 100 and a manufacturing method therefor according to one embodiment of the present invention are described with reference to FIGS. 2A to 2E and FIGS. 3A to 3D. In the following description, examples of specific materials, film thickness, size, structure, process, and the like are sometimes described, but the embodiment to which the present invention is applied is not limited to the examples, and appropriate modifications may be made within the scope not departing from the gist of the present invention.

Figure 2A:
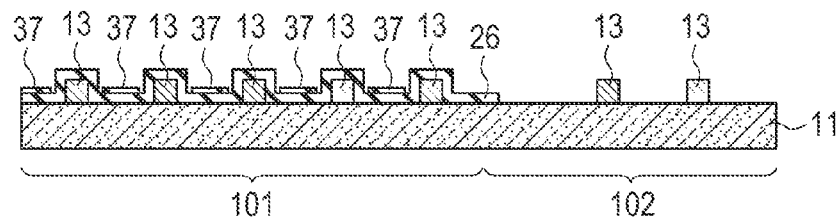
FIGS. 2A, 2B, 2C, 2D, 2E, 3A, 3B, 3C and 3D are explanatory views of a flow of manufacturing the imaging apparatus in the cross section taken along the line A-A' of FIG. 1.

In a step illustrated in FIG. 2A, a polysilicon electrode 13, a silicide block layer 26, and an etch stop layer 37 are formed on a silicon substrate 11 in the stated order. The polysilicon electrode 13 is mainly used as a gate electrode of a MOSFET formed in the silicon substrate 11. The polysilicon electrode 13 is formed above the silicon substrate 11 through intermediation of a gate insulating film (not shown).

The step illustrated in FIG. 2A further includes, in addition to the above-mentioned step, a step of forming impurity diffusion regions for photodiodes and MOSFETs in the silicon substrate 11. Illustration of those impurity diffusion regions is omitted.

The silicide block layer 26 is a film covering the silicon substrate 11 and the polysilicon electrode 13 in the pixel region 101, and is formed of a silicon oxide, a silicon nitride, or the like. The silicide block layer may formed so as to partially extend to the peripheral circuit region 102 beyond the pixel region 101, but is not formed on the polysilicon electrode 13 in the peripheral circuit region 102.

The etch stop layer 37 is a layer to be used as an etching stopper during etching of an interlayer insulating layer in a step of forming a waveguide 2 to be described later. Further, the etch stop layer 37 that remains unremoved after the step of forming the waveguide 2 functions also as a part of the waveguide. The etch stop layer 37 is formed of a silicon nitride or the like. The waveguide 2 is a member for guiding incident light to the photodiode formed in the silicon substrate 11, and hence the etch stop layer 37 is formed mainly above the photodiode.

As examples of specific film thicknesses, the polysilicon electrode 13 has a film thickness of 250 nm (nanometers), the silicide block layer 26 has a film thickness of 110 nm, and the etch stop layer 37 has a film thickness of 50 nm. In regard to the term "film thickness" as used herein, "film thickness" of a film with roughness refers to an average film thickness thereof, and "film thickness in pixel region" or "film thickness in peripheral circuit region" refers to an average value of heights of a topmost surface of films formed in each region, namely, an average value of distances from the substrate surface in each region.

The arrangement density of the polysilicon electrodes 13 generally differs between the pixel region 101 and the peripheral circuit region 102. In the pixel region 101, a large number of (for example, four per pixel) transistors need to be formed as an amplifier circuit in the pixel and a switch configured to transfer and reset electric charges in the pixel, which are formed for each pixel in the pixel region 101. On the other hand, the circuit in the peripheral circuit region 102 is, for example, a combination of a scanning circuit, a signal processing circuit, and the like, and hence an element corresponding to each pixel is not necessarily required to be prepared in the peripheral circuit region 102. Thus, the arrangement density of the polysilicon electrodes 13 is typically higher in the pixel region 101 than in the peripheral circuit region 102. Accordingly, in this case, the average film thickness of the pixel region 101 may be larger than that in the peripheral circuit region 102 at the time when the polysilicon electrodes 13 are formed.

Now, the reason why the silicide block layer 26 needs to be formed is described. In the peripheral circuit region 102, scanning, signal processing, and the like are performed, and hence high-speed operation is required. Thus, in the peripheral circuit region 102, at least one of polysilicon or the diffusion region is silicided by a metal having a high melting point to reduce the resistance thereof, thereby being capable of increasing the speed of processing.

On the other hand, in the silicidation step, if the metal having a high melting point is diffused also in a portion of the pixel region 101 in which the photodiode is formed, noise may be generated due to an increased dark current or the like. Thus, the transistor in the pixel region 101 is not silicided. In addition, the silicide block layer 26 is formed on the silicon substrate 11 and the polysilicon electrode 13 in the pixel region 101 in order to prevent or reduce the silicidation.

For the reason as described above, in this embodiment, the silicide block layer 26 is formed in the pixel region 101, but the silicide block layer 26 is not formed in the peripheral circuit region 102. Consequently, the increase in processing speed for scanning, signal processing, and the like and the reduction in noise in the photodiode are both achieved. However, when this configuration is employed, due to the presence of the silicide block layer 26 only in the pixel region 101, the film thickness difference between the pixel region 101 and the peripheral circuit region 102 after the interlayer insulating layer 12 is formed may be increased. This film thickness difference may be a cause of a global step height caused by the interlayer insulating layer 12 to be formed in a subsequent step. Thus, in subsequent steps to be described below, in order to reduce the global step height, the processing of etching the interlayer insulating layer 12 in the pixel region 101 is performed prior to the CMP step.

Figure 2B:
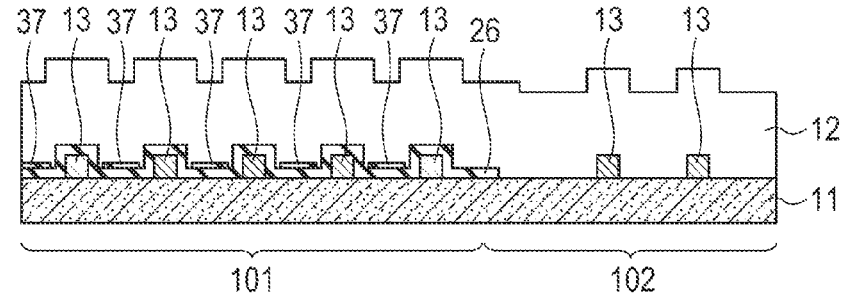

Next, the interlayer insulating layer 12 is formed in a step illustrated in FIG. 2B. The material of the interlayer insulating layer 12 is borophosphosilicate glass (BPSG). The film thickness of the interlayer insulating layer 12 after film formation is, for example, 1,600 nm. Roughness is formed in the surface of the interlayer insulating layer 12 after film formation due to the structure of the layers formed under the interlayer insulating layer 12. The structure of the layers formed under the interlayer insulating layer 12 differs between the pixel region 101 and the peripheral circuit region 102, and hence the film thickness difference may occur between the pixel region 101 and the peripheral circuit region 102.

Figure 2C:
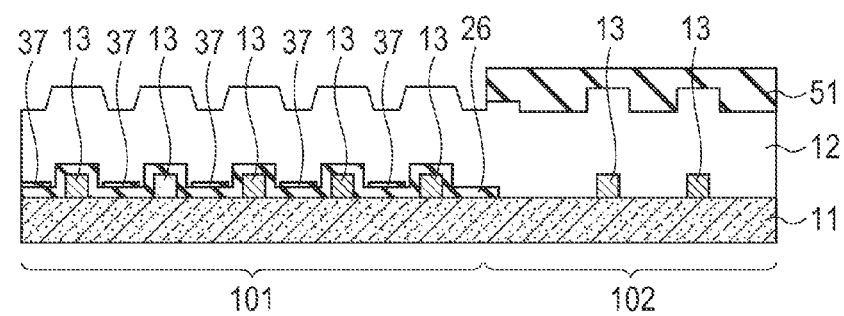

Next, in a step illustrated in FIG. 2C, a resist mask 51 such as a photoresist is formed on the interlayer insulating layer 12. In this case, the resist mask 51 is formed so that at least a part of the pixel region 101 may be open and the peripheral circuit region 102 may be protected. Under this state, the interlayer insulating layer 12 is etched to remove a part of the interlayer insulating layer 12 in the pixel region 101. Consequently, the film thickness difference of the interlayer insulating layer 12 between the pixel region 101 and the peripheral circuit region 102 is reduced. The thickness (amount of etching) of the interlayer insulating layer 12 to be removed by the etching can be determined by back calculation so that the fluctuations in film thickness of the interlayer insulating layer 12 in the pixel region 101 may be minimized. As an example, the amount of etching can be set to 100 nm.

Figure 2D:
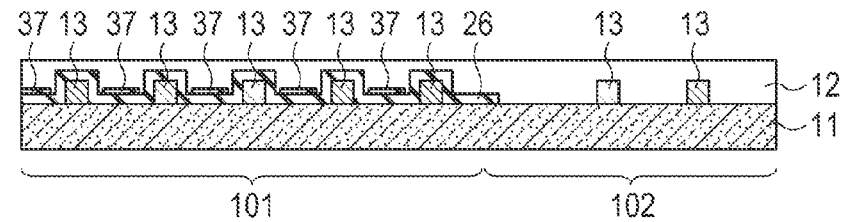

Next, in a step illustrated in FIG. 2D, the resist mask 51 is removed, and then the interlayer insulating layer 12 is planarized by CMP. Specifically, the film thickness difference between the pixel region 101 and the peripheral circuit region 102 on the top surface of the interlayer insulating layer 12 is reduced, and then the interlayer insulating layer 12 is planarized by CMP. Consequently, a difference in polishing rate for CMP between the pixel region 101 and the peripheral circuit region 102 may be reduced to reduce the global step height after the planarization. The film thickness of the planarized interlayer insulating layer 12 is, for example, 1,000 nm. After that, CMP is further performed in a step of forming interlayer lead-out wiring (not shown), and the film thickness of the interlayer insulating layer 12 becomes, for example, 650 nm.

Figure 2E:
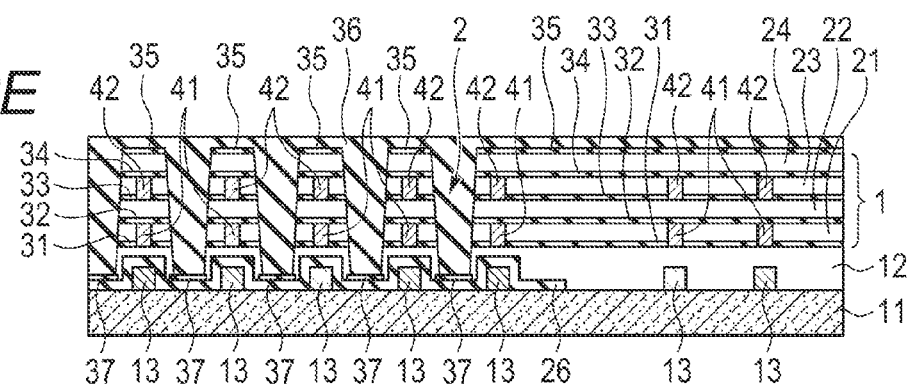

Next, in a step illustrated in FIG. 2E, an wiring layer 1 is formed on the interlayer insulating layer 12, and after that, the waveguide 2 is formed. The wiring layer 1 includes a plurality of interlayer insulating layers 21 to 24 made of a silicon oxide or the like, a plurality of interlayer insulating layers 31 to 34 made of a silicon nitride or the like, and copper wirings 41 and 42. The copper wirings 41 and 42 may be formed by a damascene process. The copper wiring 41 is formed on the interlayer insulating layer 12. In other words, the interlayer insulating layer 12 is an insulating layer formed between the silicon substrate 11 and the copper wiring 41. The copper wiring 42 is formed above the copper wiring 41 through intermediation of the interlayer insulating layer 32 and the interlayer insulating layer 22. The interlayer insulating layer 34 and the interlayer insulating layer 24 are formed on the copper wiring 42.

The waveguide 2 is formed by etching the wiring layer 1 and the interlayer insulating layer 12 to form a cavity, forming a waveguide forming film 36 to fill the cavity with the waveguide forming film 36, and planarizing the waveguide forming film 36. The above-mentioned etch stop layer 37 serves as an etching stopper during the formation of the cavity by etching. In this embodiment, a waveguide base film 35 is formed as a base layer of the waveguide forming film 36 (waveguide forming layer). For example, a silicon nitride or the like can be used as the materials for the waveguide base film 35 and the waveguide forming film 36.

The waveguide 2 formed in this manner has, for example, a truncated conical shape having a height of 1,500 nm, a top surface diameter of 1,200 nm, and a bottom surface diameter of 800 nm. The waveguide 2 has a waveguide structure for efficiently guiding incident light to a photodiode. In the waveguide 2, the waveguide forming film 36 serves as a core, and the interlayer insulating layers 12 and 21 to 24 and the like serve as a cladding. In order to satisfy waveguiding conditions, a material that is larger in refractive index than the interlayer insulating layers 12 and 21 to 24 is used for the waveguide forming film 36. As described above, a silicon nitride may be used for the waveguide forming film 36, and BPSG or a silicon oxide may be used for the interlayer insulating layers 12 and 21 to 24. Thus, the relationship of refractive indices may be satisfied.

When the waveguides 2 have large fluctuations in height, the intensity of incident light fluctuates among the photodiodes, which may be a cause of image quality deterioration, such as shading. In this embodiment, the global step height caused by the interlayer insulating layer 12 is reduced as described above. Consequently, the fluctuations in height among the waveguides 2 are reduced as well, and hence the fluctuations in light amount entering the photodiodes may be reduced to improve the image quality.

The total film thickness of the waveguide base film 35 and the waveguide forming film 36 (the thickness between the top surface of the interlayer insulating layer 24 and the top surface of the waveguide forming film 36) after film formation is, for example, 400 nm in the pixel region 101 and 1,500 nm in the peripheral circuit region 102. Specifically, the film thickness in the pixel region 101 in which the cavity portions for the waveguides 2 are formed is smaller than the film thickness in the peripheral circuit region 102, and hence the film thickness difference may occur. When this film thickness difference is large, the global step height caused by the waveguide base film 35 and the waveguide forming film 36 is increased after the planarization by CMP, which may be a cause of image quality deterioration.

In view of the above, similarly to the case of the interlayer insulating layer 12, the waveguide forming film 36 in the peripheral circuit region 102 is partially removed by selective etching, to thereby reduce the film thickness difference between the pixel region 101 and the peripheral circuit region 102. After that, the surface of the waveguide forming film 36 is planarized by CMP. The amount of etching of the waveguide forming film 36 in this step is, for example, 800 nm, and the film thickness of the planarized waveguide forming film 36 is, for example, 200 nm. According to this method, the film thickness difference between the pixel region 101 and the peripheral circuit region 102 is reduced to reduce the global step height caused by the waveguide base film 35 and the waveguide forming film 36, to thereby improve the image quality.

Figure 3A:
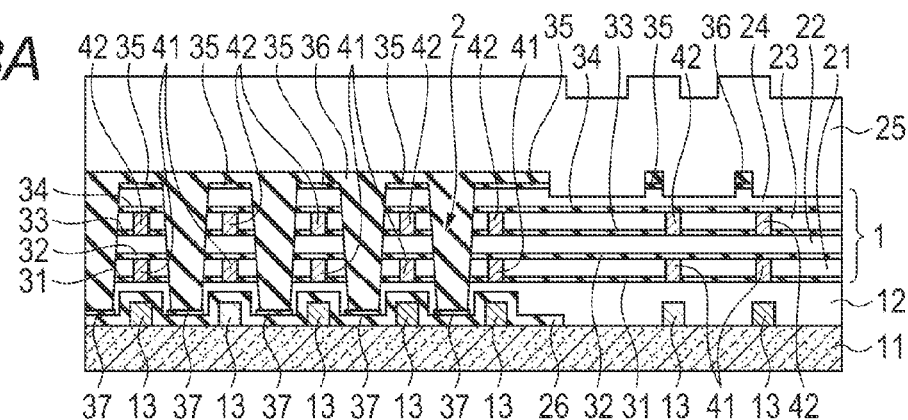

Next, in a step illustrated in FIG. 3A, at least a part of the waveguide base film 35 and a part of the waveguide forming film 36 in the peripheral circuit region 102 are selectively removed, and an interlayer insulating layer 25 made of a silicon oxide or the like is formed. Due to roughness formed when a part of the films in the peripheral circuit region 102 are removed, roughness may be formed in the surface of the interlayer insulating layer 25 in the peripheral circuit region 102. On the other hand, the nitride films in the pixel region 101 are not removed, and hence roughness caused by the removal of the films are not formed in the surface of the interlayer insulating layer 25 in the pixel region 101. Thus, the film thickness difference may occur between the pixel region 101 and the peripheral circuit region 102. In FIG. 3A, the case where a part of the waveguide base film 35 and a part of the waveguide forming film 36 in the peripheral circuit region 102 remain unremoved is illustrated, but all of the waveguide base film 35 and the waveguide forming film 36 in the peripheral circuit region 102 may be removed.

Figure 3B:
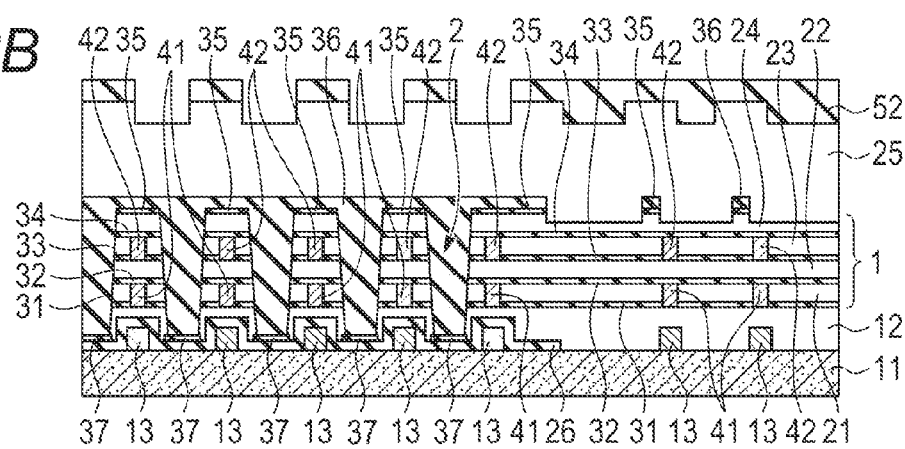

Next, in a step illustrated in FIG. 3B, similarly to the step of FIG. 2C, a resist mask 52 is formed on the interlayer insulating layer 25, and etching is performed in the pixel region 101. This step reduces the film thickness difference between the pixel region 101 and the peripheral circuit region 102 on the top surface of the interlayer insulating layer 25.

The resist mask 52 is arranged so as to cover all or a part of the peripheral circuit region 102. The resist mask 52 may be arranged so as not to cover the pixel region 101, or may be arranged so as to cover a part of the pixel region 101. The arrangement pattern of the resist mask 52 in the pixel region 101 can be determined in consideration of the shape of roughness in the interlayer insulating layer 25, the film thickness distribution of the interlayer insulating layer 25, and the like. As an example, patterns of 3,000 nm square each are arranged periodically at intervals of 1,300 nm. The amount of etching can be determined by back calculation so that, for example, the fluctuations in film thickness of the interlayer insulating layer 25 in the pixel region 101 may be minimized. As an example, the amount of etching is set to 380 nm.

Figure 3C:
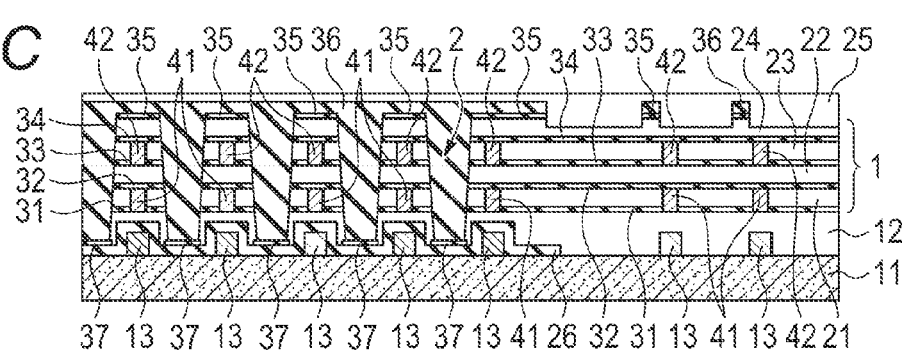

Next, in a step illustrated in FIG. 3C, the resist mask 52 is removed, and then the interlayer insulating layer 25 is planarized by CMP. Similarly to the case of the planarization of the interlayer insulating layer 12 described above, the film thickness difference between the pixel region 101 and the peripheral circuit region 102 after the planarization may be reduced to reduce the global step height.

Figure 3D:
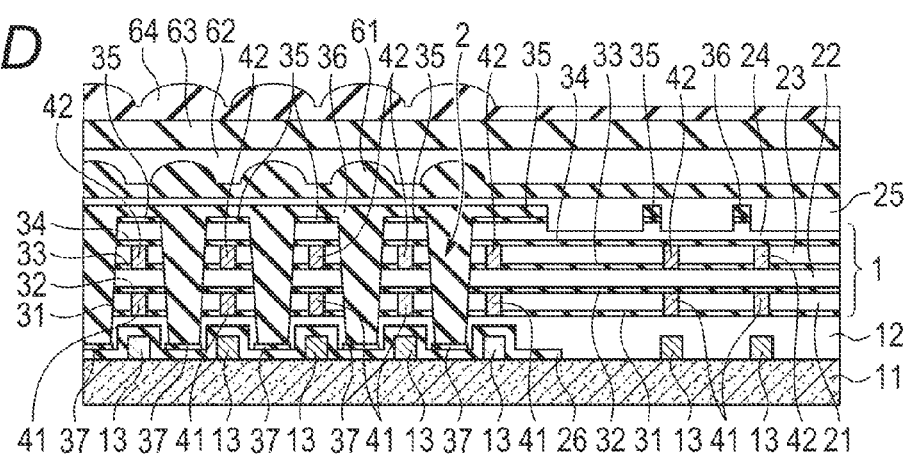

Next, in a step illustrated in FIG. 3D, an wiring layer (not shown), an inner-layer lens 61, a planarization layer 62, a color filter 63, and a microlens 64 are formed. Light entering the imaging apparatus 100 is condensed by the microlens 64 and the inner-layer lens 61, and passes through the color filter 63, the waveguide 2, and the like to enter a photodiode formed in the silicon substrate 11. According to this embodiment, the global step height caused by the interlayer insulating layers 12 and 25 and the waveguide forming film 36 may be reduced. Thus, the fluctuations in distance between the inner-layer lens 61, the microlens 64, and the like and the photodiode may be reduced to reduce the fluctuations in intensity of light entering the photodiode. Consequently, the imaging apparatus 100 having improved image quality can be provided by the method of manufacturing the imaging apparatus 100 according to this embodiment.

The imaging apparatus provided by the above-mentioned embodiment is applicable to an imaging system. The imaging system includes not only an apparatus having the main purpose of photographing, but also an apparatus having a photographing function secondarily. More specific examples of the imaging system include a digital still camera, a digital camcorder, a camera head, a copying machine, a facsimile machine, a mobile phone, an on-board camera, and an observation satellite.

The imaging system includes the imaging apparatus exemplified in the above-mentioned embodiment, and a processing unit configured to process signals output from the imaging apparatus. The processing unit may include, for example, an A/D converter and a processor configured to process digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-184866, filed Sep. 11, 2014, which is hereby incorporated by reference herein in its entirety.

What is claimed is:

1. A method of manufacturing an imaging apparatus, the imaging apparatus being formed on a substrate, the imaging apparatus comprising:
   a pixel region including a photoelectric conversion element; and
   a peripheral circuit region that is arranged on a periphery of the pixel region, the pixel region and the peripheral circuit region each comprising a transistor having an electrode,
the method comprising:
   forming a silicide block layer so as to cover the transistor in the pixel region, wherein the silicide block layer is not formed on the electrode of the transistor in the peripheral circuit region;
   forming an etch stop layer above the photoelectric conversion element in the pixel region, wherein the etch stop layer is not formed in the peripheral circuit region;
   forming an insulating layer in the pixel region and the peripheral circuit region;
   etching the insulating layer formed in the pixel region in a state in which the peripheral circuit region is protected;
   planarizing a surface of the insulating layer; and
   forming a waveguide in the pixel region,
   wherein, after the forming of the insulating layer and before the etching of the insulating layer, an average value of heights of a top surface of the insulating layer in the pixel region is larger than an average value of heights of a top surface of the insulating layer in the peripheral circuit region,
   wherein a difference between the average value of heights of the top surface of the insulating layer in the pixel region and the average value of heights of the top surface of the insulating layer in the peripheral circuit region is caused by a difference of arrangements of the silicide block layer and the etch stop layer between the pixel region and the peripheral circuit region; and
   wherein the etching results in the difference between the average value of heights of the top surface of the insulating layer in the pixel region and the average value of heights of the to surface of the insulating layer in the peripheral circuit region being reduced.

2. The method according to claim 1, further comprising siliciding the electrode of the transistor in the peripheral circuit region.

3. The method according to claim 1, wherein the imaging apparatus comprises a wiring formed from a plurality of layers, and
   wherein the insulating layer is formed between a layer closest to the substrate among the plurality of layers in which the wiring is formed, and the substrate.

4. The method according to claim 1, wherein the insulating layer comprises borophosphosilicate glass.

5. The method according to claim 1, wherein the planarizing comprises chemical mechanical polishing.

6. The method according to claim 1, wherein the forming of the waveguide comprises:
   etching the insulating layer to form a cavity; and
   forming a waveguide forming layer inside the cavity.

7. The method according to claim 6, wherein the waveguide forming layer comprises a material having a refractive index that is larger than a refractive index of the insulating layer.

8. The method according to claim 6,
   wherein a material of the insulating layer comprises one of borophosphosilicate glass and a silicon oxide, and
   wherein a material of the waveguide forming layer comprises a silicon nitride.

* * * * *